United States Patent
Ouyang et al.

(10) Patent No.: US 6,921,695 B2
(45) Date of Patent: Jul. 26, 2005

(54) ETCHING METHOD FOR FORMING A SQUARE CORNERED POLYSILICON WORDLINE ELECTRODE

(75) Inventors: Hsiu Ouyang, Taipei (TW); Chi-Hsin Lo, Chu-Pei (TW); Chen-Ming Huang, Jungli (TW); Chia-Ta Hsieh, Tainan (TW); Chia-Shiung Tsai, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/685,127

(22) Filed: Oct. 14, 2003

(65) Prior Publication Data
US 2005/0079672 A1 Apr. 14, 2005

(51) Int. Cl.[7] ............................................. H01L 21/336
(52) U.S. Cl. ........................ 438/257; 438/265; 438/266; 438/267; 438/596; 438/696; 438/697; 438/704; 438/719; 438/727; 438/730
(58) Field of Search ................................ 438/257–267, 438/596, 696–697, 704, 719, 727, 730

(56) References Cited

U.S. PATENT DOCUMENTS

| | | | | |
|---|---|---|---|---|
| 6,482,700 B2 | * | 11/2002 | Chen et al. | 438/267 |
| 6,569,736 B1 | * | 5/2003 | Hsu et al. | 438/267 |
| 6,706,602 B2 | * | 3/2004 | Hsu et al. | 438/267 |
| 6,762,096 B1 | * | 7/2004 | Meng et al. | 438/267 |
| 6,780,785 B2 | * | 8/2004 | Hsieh | 438/745 |
| 6,784,039 B2 | * | 8/2004 | Hsieh | 438/201 |
| 6,787,418 B2 | * | 9/2004 | Chu et al. | 438/259 |
| 6,855,602 B2 | * | 2/2005 | Chang et al. | 438/264 |
| 2004/0077144 A1 | * | 4/2004 | Hsieh | 438/257 |

* cited by examiner

Primary Examiner—Mary Wilczewski
Assistant Examiner—Toniae M. Thomas
(74) Attorney, Agent, or Firm—Tung & Associates

(57) ABSTRACT

A split gate FET wordline electrode structure and method for forming the same including an improved polysilicon etching process including providing a semiconductor wafer process surface comprising first exposed polysilicon portions and adjacent oxide portions; forming a first oxide layer on the exposed polysilicon portions; blanket depositing a polysilicon layer on the first exposed polysilicon portions and adjacent oxide portions; forming a hardmask layer on the polysilicon layer; carrying out a multi-step reactive ion etching (RIE) process to etch through the hardmask layer and etch through a thickness portion of the polysilicon layer to form second polysilicon portions adjacent the oxide portions having upward protruding outer polysilicon fence portions; contacting the semiconductor wafer process surface with an aqueous HF solution; and, carrying out a downstream plasma etching process to remove polysilicon fence portions.

20 Claims, 2 Drawing Sheets

ETCHING METHOD FOR FORMING A SQUARE CORNERED POLYSILICON WORDLINE ELECTRODE

FIELD OF THE INVENTION

This invention generally relates to processing method for forming semiconductor device structures, and more particularly to a method for forming self-aligned polysilicon wordline electrodes for use with a split gate FET flash memory device.

BACKGROUND OF THE INVENTION

In the flash EEPROM (Electrically Erasable Programmable Read Only Memories) including split gate FET devices, for example, including polysilicon source and wordline electrodes, the level of the voltage required to be applied, to the control gate in a split gate field effect transistor (FET) flash memory device structure is critical and is affected by the profile of the polysilicon electrode, also referred to as a wordline spacer which functions as the control gate in a split gate flash memory configuration. For example, the polysilicon spacer (electrode) profile can affect the series resistance and hence the electrical stability of the control gate, for example, including altering hot electron injection processes or Fowler-Nordheim tunneling processes which adversely affect the stability of the control gate thereby adversely affecting the reliability of write and erase operations, both processes essential to the reliable operation of flash memory devices. For example, the electric field strength present at a polysilicon electrode/gate oxide (tunnel oxide) interface, determines the desired flow of current in response to applied voltages to accomplish write and erase operations.

In the formation of polysilicon word and source line electrodes in conjunction with a split gate FET device, for example employing a self-aligned polysilicon wordline electrode in a split gate FET configuration, a consistent and predictable profile of the polysilicon structure is critical to proper electrical functioning of the device. As design rules have decreased to below about 0.25 micron technology, achieving acceptable etching profiles of the polysilicon structures has become increasingly difficult due to several hard to control RIE etching phenomena including polymeric residue formation and micro-trenching as a result of secondary plasma ion bombardment. In addition, problems are presented in RIE etching processes where different doping levels of polysilicon are present causing variable etching rates.

One particular problem in polysilicon RIE etching processes, for example in the formation of a self aligned polysilicon structure, is preferential etching and accumulation of polymeric RIE etching residues at an upper portion of the polysilicon structure to produce a fence or raised portion at outer edges of the upper portion of the polysilicon structure. For example, during prior art RIE etching processes to form self aligned polysilicon wordline electrodes, the formation of fences which are composed of a hardmask and polysilicon layer at an outer edge of the upper portion of the polysilicon structure has been a recurring problem which undesirably alters the etching profile of the polysilicon structure to cause undesired variations in polysilicon electrical resistances and presents the potential for causing electrical shorting to subsequently formed overlying wiring, for example, bit lines.

There is therefore a need in the split gate FET device processing art to develop improved etching processes to improve the etching profile of a self-aligned polysilicon wordline electrode structure and thereby improve the yield and reliable operation of split gate FET devices including flash memory devices.

It is therefore an object of the invention to provide an improved etching process to improve the etching profile of a self-aligned polysilicon wordline electrode structure and thereby improve the yield and reliable operation of split gate FET devices including flash memory devices, while overcoming other deficiencies and shortcomings of the prior art.

SUMMARY OF THE INVENTION

To achieve the foregoing and other objects, and in accordance with the purposes of the present invention as embodied and broadly described herein, the present invention provides a split gate FET wordline electrode structure and method for forming the same including a split gate FET wordline electrode structure and method for forming the same including an improved polysilicon etching process.

In a first embodiment, the method includes providing a semiconductor wafer process surface comprising first exposed polysilicon portions and adjacent oxide portions; forming a first oxide layer on the exposed polysilicon portions; blanket depositing a polysilicon layer on the first exposed polysilicon portions and adjacent oxide portions; forming a hardmask layer on the polysilicon layer; carrying out a multi-step reactive ion etching (RIE) process to etch through the hardmask layer and etch through a thickness portion of the polysilicon layer to form second polysilicon portions adjacent the oxide portions having upward protruding outer polysilicon fence portions; contacting the semiconductor wafer process surface with an aqueous HF solution; and, carrying out a downstream plasma etching process to remove polysilicon fence portions.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to an exemplary embodiment including the formation of square-shouldered (box-shaped) self aligned wordline electrodes in a split gate configuration for use in an EEPROM (flash memory) device, it will be appreciated that the method of the present invention may be advantageously used in the formation of any self-aligned polysilicon structure where the polysilicon structure is advantageously etched to provide a square-shouldered profile while avoiding preferential RIE etching in an upper portion of the polysilicon structure.

For example referring to FIGS. 1A to 1E, are shown cross sectional schematic views of an exemplary portion of a memory cell including a split gate FET structure at stages in manufacture for use in a flash memory device.

Figure 1A:
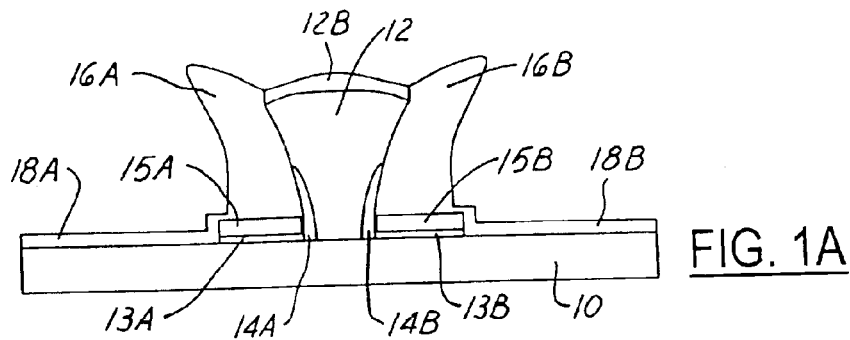
FIGS. 1A–1E are cross sectional schematic views of a portion of a split gate FET device including wordline electrodes at stages in manufacture according to an embodiment of the present invention.

Shown in FIG. 1A is source polysilicon gate structures 12 formed over doped silicon substrate (e.g., wafer) 10 including doped source regions (not shown) formed in the silicon substrate 10 underlying the source polysilicon gate electrode 12. Adjacent first dielectric sidewall spacers e.g., 14A, 14B, for example, formed of silicon nitride (e.g., SiN) are provided along the sidewalls of the polysilicon gate 12. Floating gate polysilicon electrodes e.g. 15A and 15B are provided adjacent either side of the source polysilicon gate electrode 12 overlying a first gate oxide layer e.g., 13A, 13B, respectively, for example a thermally grown oxide layer, isolated from the source polysilicon gate electrode 12 by the first dielectric sidewall spacers e.g., 14A and 14B.

Formed overlying the floating gate polysilicon electrode e.g., 15A and 15B, are second dielectric sidewall spacers e.g., 16A and 16B, for example silicon oxide formed of PECVD TEOS oxide. Also provided is a tunnel oxide layer, e.g., 18A, 18B, formed over exposed portions of the silicon substrate 10 adjacent the floating gate electrodes, formed by a conventional thermal oxide growing to form a silicon oxide (e.g., $SiO_2$) layer, for example, from about 100 Angstroms to about 200 Angstroms, more preferably about 150 Angstroms in thickness.

A thermally grown $SiO_2$ layer, also referred to as an inter-poly dielectric may be formed at the same time as the tunnel oxide portions e.g., 18A, 18B to cover the exposed sidewalls of the floating gate polysilicon electrodes e.g. 15A and 15B, and form an oxide layer over the exposed polysilicon source electrode 12 upper portion e.g., 12B, preferably formed having a thickness of about 100 Angstroms to about 200 Angstroms. In addition, isolation trenches (not shown) may be provided adjacent the memory cell region, for example a flash memory cell region forming a split gate field effect transistor (FET) configuration.

Figure 1B:
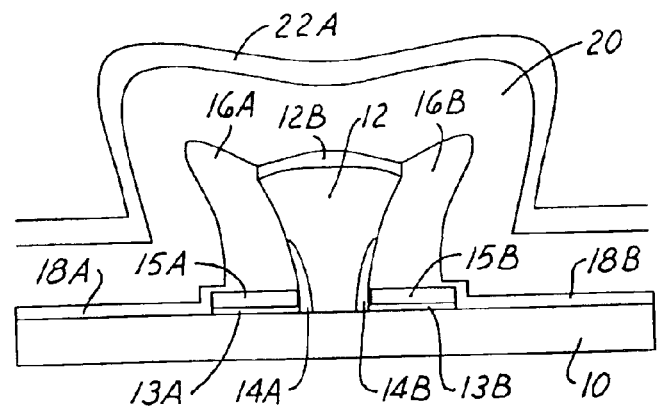

Referring to FIG. 1B, polysilicon layer 20 is blanket deposited by a conventional LPCVD process to cover the process surface including the split gate FET structure. In one embodiment, the polysilicon layer is deposited as in-situ doped amorphous polysilicon. For example, charge carrier generating N or P doping is added in-situ in a CVD amorphous polysilicon deposition process carried out at temperatures of less than about 580° C. to avoid crystallization, for example adding dopant gas, such as diborane ($B_2H_6$), phosphine ($PH_3$) or arsine ($AsH_3$) during the deposition process. Preferably, the polysilicon layer 20 is formed having one of an N or P doping concentration of greater than about $1\times10^{16}$ dopant atoms/$cm^2$. The formation of polysilicon in the amorphous form as well as the doping level are important factors in producing a subsequent oxide hardmasks having uniform thickness, which is important in polysilicon RIE etching. For example, it has been found the higher level of doping advantageously accelerates oxide growth thereby reducing a thermal processing time and minimizes crystallization and/or grain growth of the polysilicon layer 20 in subsequent thermal oxide growth processes. Preferably, the polysilicon layer 20 is formed to a thickness of about 1000 Angstroms to about 3000 Angstroms.

Still referring to FIG. 1B, a hard mask layer 22A is deposited over the polysilicon layer 20. The hardmask layer may be formed of silicon oxide (e.g., $SiO_2$), or silicon oxynitride (e.g., SiON) or silicon nitride (e.g., SiN). If the hardmask layer is a nitride, it may be formed by one of LPCVD, PECVD or HDP-CVD. In the case when the hardmask layer is silicon oxide ($SiO_2$), it may be formed by thermal oxide growth, PECVD process, or plasma oxidation process. In a preferred embodiment, the hardmask layer is $SiO_2$, thermally grown to a thickness of about 200 Angstroms to about 400 Angstroms. For example, an RTO process to grow the thermal oxide at a temperature of about 800° C. to 900° C. may be used to form a dense oxide and to minimize polysilicon crystallization and/or grain growth. However other methods such as in-situ-steam-generated (ISSG) methods of growing oxide layers or dry furnace oxidation methods may be used as well.

According to an embodiment of the invention, a first RIE etching process, preferably a high density plasma formed by a transformer coupled plasma (TCP) source or inductively coupled plasma (ICP) source, also referred to as a dual source plasma (DSP), is used for the multi-step RIE etching process since etching speed and selectivity are enhanced.

Figure 1C:
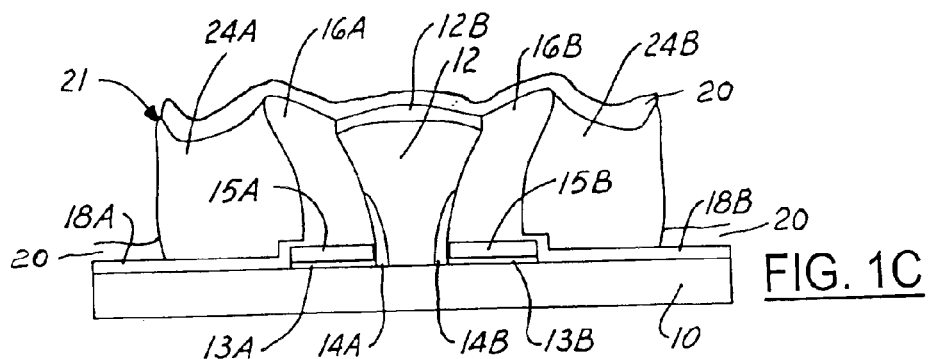

Referring to FIG. 1C, in the first step of the multi-step RIE etching process, the hardmask layer 22A, for example silicon oxide is etched in a first step to oxide breakthrough using a $CF_4$ etching chemistry to expose the underlying polysilicon layer 20 portion. The preferred RIE etching parameters include a plasma pressure of about 2 to about 15 milliTorr using $CF_4$ at a flow rate of about 20 to about 120 sccm. The RF source power is preferably supplied between about 100 to about 1000 Watts including a bias RF power at about 10 to about 200 Watts.

Still referring to FIG. 1C, in a second step of the RIE etching process, the polysilicon is partially etched in a main etching process including a $CF_4/HBr/Cl_2/He$—$O_2$ etching chemistry. The preferred RIE etch parameters for the main etching step include a plasma pressure of about 2 to about 15 milliTorr using $CF_4$ at a flow rate of about 5 to about 100 sccm, $Cl_2$ at a flow rate of between about 15 and 150 sccm, HBr at a flow rate of about 20 to about 200 sccm, and helium and oxygen each at a flow rate of about 3 to about 30 sccm. The RF source power is preferably supplied between about 100 to about 1000 Watts including a bias RF power at about 10 to about 200 Watts.

Figure 1D:
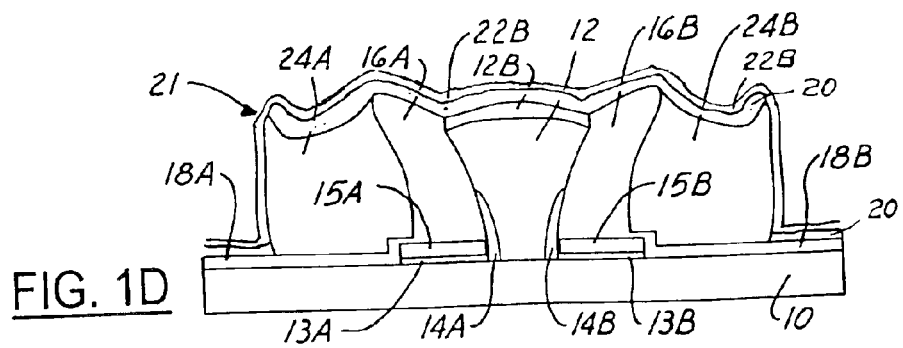

In one embodiment, referring to FIG. 1D, following the second (main) polysilicon etching process an in-situ oxygen plasma treatment is carried out at a pressure of about 2 to about 100 milliTorr, an RF power of about 200 to about 1000 Watts, and a bias power of about 10 to about 200 Watts, with the oxygen provided at a flow rate of about 10 to about 100 sccm. The plasma oxygen treatment has the effect of forming an oxygen layer e.g., 22B over the wafer polysilicon surface. Preferably, the plasma formed oxide layer 22B is formed at a thickness of about 10 Angstroms to about 100 Angstroms.

Following the in-situ oxygen plasma treatment to form the plasma formed oxide layer 22B, a second oxide breakthrough etching process is carried out with the same etching parameters as the first oxide breakthrough etching process followed by a second main etching step to expose the inter-poly-silicon oxide layer portion 12B overlying the polysilicon source line electrode, 12 and the upper portion of adjacent oxide spacers, 16A, and 16B, and form an outline of self-aligned polysilicon wordline electrodes, 24A and 24B.

Following etching the oxide layer 22B, a polysilicon overetching step is then carried out with an essentially chlorine-free HBr/He—$O_2$ etching chemistry to complete the etching of the outline of the polysilicon wordline electrodes 24A and 24B and to remove remaining polysilicon residues overlying adjacent exposed oxide layers. This process, however, deteriorates the polysilicon wordline electrodes e.g., 24A and 24B and increases protrusion of the fence portions e.g., 21 at the outer edge portions of the polysilicon. The chlorine-free etching chemistry in the overetching process is preferred since the rate of chlorine etching has been found to depend partially on polysilicon doping, thus resulting in variable etching rates and for example undesirably undercutting polysilicon portions. The preferred RIE etching parameters include a plasma pressure of about 10 to about 120 milliTorr, an RF source power of about 200 to about 2000 Watts, a bias power of about 15 to about 250 Watts and an HBr flow rate of about 20 to about 200 sccm including helium and oxygen each at about 2 to about 15 sccm.

Following the polysilicon overetching step, fence portions, e.g., 21 formed of RIE etching residues formed at the outer edges of the polysilicon wordline electrodes e.g., at 24A and 24B thereby creating an undesirable etching profile which leads to subsequent electrical operation instability in the split gate FET device. An aspect of the present invention is directed to forming a square-shouldered corner at outer edges of the polysilicon wordline electrodes thereby avoiding the formation of fence portions as explained further below.

Figure 1E:
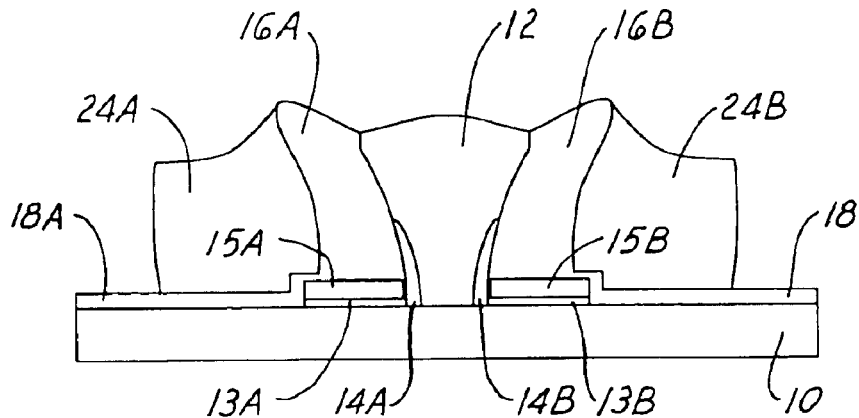

Referring to FIG. 1E, following the multi-step RIE process outlined above, in a preferred embodiment, the process wafer is subjected to an aqueous hydrofluoric (HF) solution dipping treatment to at least partially remove accumulated RIE etching residues remaining on the wafer process surface, including the fence portions, e.g., 21 and any remaining oxide layer e.g., 12B and 22B overlying the polysilicon portions. The process wafer is preferably dipped for a period from about 10 seconds to about 100 seconds, more preferably from about 10 seconds to about 20 seconds. The HF solution treatment may optionally take place ex-situ, but preferably is accomplished in-situ (without exposure to atmosphere), for example in an aqueous HF solution bath included in the cluster tool environment. Preferably, the aqueous HF solution includes from about 0.3 volume % to about 0.7 volume %, more preferably about 0.5 volume % HF in deionized water ($H_2O$).

Following the RIE overetching process, the process wafer is subjected to an in-situ downstream etching process, also referred to as chemical dry etching (CDE), where the plasma is created upstream from the plasma wafer and transported down stream to contact the wafer where primarily chemical dry etching takes place without plasma ion bombardment energies contributing to the etching process. For example, separate RIE etchers and CDE etchers may be provided in a cluster tool arrangement where the process wafer is transferred from the RIE etcher to the CDE etcher without exposure to atmospheric pressure during transfer. By the term 'in-situ' is meant without exposure to atmosphere between processes. In addition, commercially available etchers that provide both RIE plasma etching capabilities and CDE etching capabilities may be suitably used.

During the CDE etching process, a fluorocarbon/oxygen etching chemistry is used to remove remaining polysilicon residues and to square the shoulders of the top portion of the polysilicon wordline electrodes, e.g., 24A and 24B without ion bombardment. Preferred process parameters include a downstream processing pressure of about 10–50 Pa, an RF source power of about 20–1000 Watts, a $CF_4$ flow rate of about 2–200 sccm, and an $O_2$ flow rate of about 20 to about 400 sccm.

Still referring to FIG. 1E, the HF treatment process together with the CDE etching process has the effect of fully removing the fence portions, e.g., 21 shown in FIG. 1D, including fluoro-polymer/oxide containing residues and squaring the shoulder of outer edges of the top portion of the polysilicon word line electrodes e.g., 24A and 24B to produce a box-shaped, square-shouldered polysilicon wordline electrodes.

The CDE process advantageously avoids damaging the polysilicon surface, tunnel and gate oxides. For example, a conventional RIE etching process tends to damage these structures in an overetch process as a result of ion bombardment, for example causing micro-trenching due to preferential etching as underlying oxide layers are exposed in the etching process. As such, the fence portions, e.g., 21 formed on the outer edges of the upper portions of the polysilicon wordline electrodes are effectively removed without micro-trenching of exposed gate oxides or damaging exposed polysilicon portions. Following the CDE treatment, the process wafer is optionally subjected to a second aqueous HF treatment for a period of from about 10 seconds to about 100 seconds, more preferably from about 30 seconds to about 60 seconds.

In another embodiment of the RIE etching process a fluorocarbon/oxygen etching chemistry is used for both the initial oxide breakthrough etch and the polysilicon main etch. For example, plasma processing conditions during the oxide breakthrough etch preferably include a plasma pressure of from about 10–50 Pa, an RF source power of 200 to 1000 Watts, no bias power, and a flow rate of $CF_4$ and $O_2$ each from about 20 to about 200 sccm. Following the oxide breakthrough etch, the polysilicon main etch is carried out under the same range of plasma process conditions as outlined for the oxide breakthrough etch step. Following the polysilicon main etch process (including overetching), the process wafer is subjected to the aqueous HF treatment according to preferred embodiments followed by a downstream CDE etch process according to preferred embodiments described above. Following the downstream CDE etching process, the process wafer is optionally subjected to a second aqueous HF treatment.

Advantageously, according to the present invention, the improved etching process, including the separate RIE etching process embodiments which are preferably followed by an aqueous HF treatment prior to a downstream CDE treatment advantageously allows the manufacture of polysilicon wordline electrodes e.g., 24A and 24B, with an improved square shouldered profile where the outer edges are corner shaped (square-shouldered) approaching an angle of about 90 degrees within about plus or minus 10 degrees. The improved profile improves the electrical stability and reliability of operation of a memory device according to a split gate FET configuration. For example, the sequential etching process of the present invention may be applied to form structures having design rule dimensions associated with 0.25 micron process technology and below, for example in formation of split gate FET devices having 0.18 micron structure design rules. Another advantage of the method of the present invention is that the etching process for forming the polysilicon wordline electrodes process may be carried out in-situ and advantageously without the necessity of photolithographic patterning.

Figure 2:
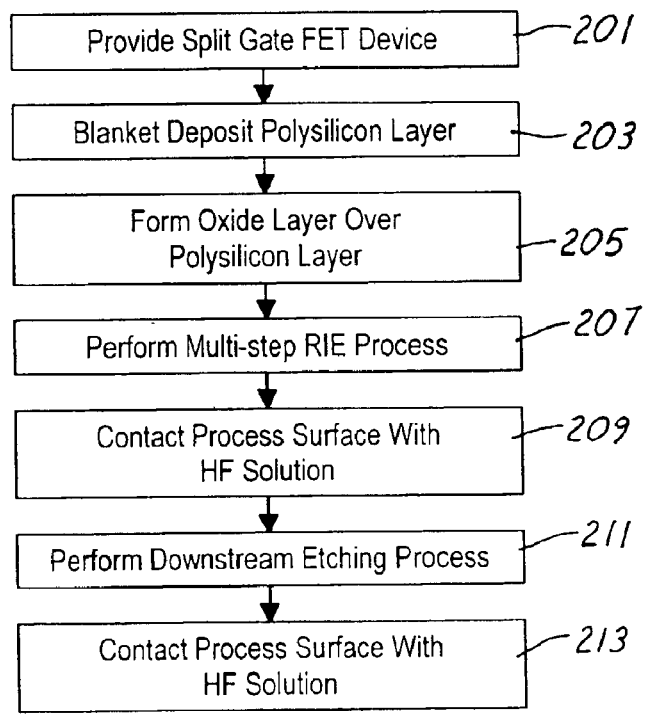
FIG. 2 is a process flow diagram including several embodiments of the present invention.

Referring. to FIG. 2 is a process follow diagram including several embodiments of the present invention. In process 201, a polysilicon source line electrode with adjacent polysilicon floating gate electrodes are provided in a split gate FET configuration on a process wafer. In process 203, a polysilicon layer is blanket deposited to cover the split gate FET structure. In process 205, a silicon oxide or silicon oxynitride layer is blanket deposited over the polysilicon layer. In process 207, a multi-step RIE etching process is carried out according to preferred embodiments. In process 209, the process wafer is subjected to an aqueous HF treatment according to preferred embodiments. In process 211, the process wafer is subjected to a downstream CDE etching process. In process 213, the process wafer is subjected to an optional second aqueous HF treatment according to preferred embodiments.

The preferred embodiments, aspects, and features of the invention having been described, it will be apparent to those skilled in the second art that numerous variations, modifications, and substitutions may be made without departing from the spirit of the invention as disclosed and further claimed below.

What is claimed is:

1. A method for an improved polysilicon etching process for forming self-aligned polysilicon micro-integrated circuit structures without protruding polysilicon portions comprising the steps of:
   providing a semiconductor wafer process surface comprising first exposed polysilicon portions and adjacent oxide portions;
   forming a first oxide layer on the exposed polysilicon portions;
   blanket depositing a polysilicon layer on the first exposed polysilicon portions and adjacent oxide portions;
   forming a hard mask layer on the polysilicon layer;
   carrying out a multi-step reactive ion etching (RIE) process to etch through the hardmask layer and etch through a thickness portion of the polysilicon layer to form second polysilicon portions adjacent the oxide portions having upward protruding outer polysilicon fence portions;
   contacting the semiconductor wafer process surface with an aqueous HF solution; and,
   carrying out a downstream plasma etching process to remove polysilicon fence portions.

2. The method of claim 1, wherein the multi-step RIE etching step further comprises:
   etching through a thickness of the hardmask layer in a first etching step;
   etching through a thickness portion of the polysilicon layer to form the second polysilicon portions in a second etching step;
   blanket forming a second oxide layer over second polysilicon portions;
   etching through a thickness portion of the second oxide layer to expose the second polysilicon silicon portions and first oxide layer in a third etching step; and,
   over-etching the second polysilicon portions to endpoint in a fourth etching step.

3. The method of claim 2 wherein the second etching step comprises an etching chemistry including $CF_4/HBr/Cl_2/He-O_2$.

4. The method of claim 2 wherein the overetching step comprises a chlorine-free etching chemistry.

5. The method of claim 4 wherein the chlorine free etching chemistry comprises $HBr/He-O_2$.

6. The method of claim 1, wherein the step of forming the first oxide layer is a thermal growth process.

7. The method of claim 2, wherein the step of forming the second oxide layer comprises an in situ oxygen plasma process.

8. The method of claim 1, wherein the step of contacting the semiconductor wafer process surface with an aqueous HF solution comprises a dipping process.

9. The method of claim 1, wherein the aqueous HF solution comprises an HF concentration of 0.3 to 0.7 volume percent HF in deionized water with respect to a solution volume.

10. The method of claim 1, wherein the downstream plasma etching process comprises a chemical dry etching (CDE) process including etching chemistry including $CF_4$ and $O_2$.

11. The method of claim 1, further comprising the step of contacting the semiconductor wafer process surface with an aqueous HF solution following the step of carrying out a downstream plasma etching process.

12. A method for an improved polysilicon etching process for forming square shouldered self-aligned polysilicon word line electrodes in a split-gate FET configuration comprising the steps of:
   providing a semiconductor wafer process surface comprising a polysilicon source electrode including adjacent polysilicon floating gate electrodes and oxide spacers overlying the polysilicon floating gate electrodes;
   thermally growing a first oxide layer on exposed polysilicon portions;
   blanket depositing a polysilicon layer on the semiconductor wafer process surface;
   forming a silicon oxide hardmask layer on the polysilicon layer;
   reactive ion etching (RIE) through the hardmask layer thickness in a first etching step;
   reactive ion etching (RIE) through a thickness portion of the polysilicon layer to partially form polysilicon wordline portions adjacent the oxide spacers in a second etching step;
   plasma forming a second oxide layer over second polysilicon portions according to an oxygen plasma process;
   reactive ion etching (RIE) through a thickness portion of the second oxide layer to expose the second polysilicon silicon portions and first oxide layer in a third etching step;
   reactive ion etching (RIE) the second polysilicon portions to endpoint in a fourth etching step including forming upward protruding polysilicon fences at an outer portion of the second polysilicon portions;
   contacting the semiconductor wafer process surface with an aqueous HF solution; and,
   carrying out a downstream plasma etching process comprising a $CF_4$ and $O_2$ etching chemistry to remove the polysilicon fences.

13. The method of claim 12, wherein the second etching step comprises an etching chemistry including $CF_4/HBr/Cl_2/He-O_2$.

14. The method of claim 12, wherein the fourth etching step comprises a chlorine-free etching chemistry.

15. The method of claim 12 wherein the chlorine free etching chemistry comprises $HBr/He-O_2$.

16. The method of claim 12, wherein the step of contacting the semiconductor wafer process surface with an aqueous HF solution comprises a dipping process.

17. The method of claim 12, wherein the aqueous HF solution comprises an HF concentration of 0.3 to 0.7 volume percent HF in deionized water with respect to a solution volume.

18. The method of claim 12, wherein the downstream plasma etching process comprises a chemical dry etching (CDE) process including etching chemistry including $CF_4$ and $O_2$.

19. The method of claim 12, further comprising the step of contacting the semiconductor wafer process surface with an aqueous HF solution following the step of carrying out a downstream plasma etching process.

20. The method of claim 12, wherein the second etching step comprises fluorocarbon/$O_2$ etching chemistry.

* * * * *